United States Patent [19]

Ishigaki et al.

[11] 4,166,251
[45] Aug. 28, 1979

[54] SYSTEM FOR REMOVING INTERFERENCE DISTORTION IN THE DEMODULATED SIGNAL OF A FREQUENCY-MODULATED SIGNAL

[75] Inventors: Yukinobu Ishigaki, Yamato; Teruo Muraoka, Yokohama, both of Japan

[73] Assignee: Victor Company of Japan, Ltd., Yokohama, Japan

[21] Appl. No.: 909,663

[22] Filed: May 25, 1978

[30] Foreign Application Priority Data

May 30, 1977 [JP] Japan ................................ 52-63048
Jun. 14, 1977 [JP] Japan ................................ 52-70254
Jun. 29, 1977 [JP] Japan ................................ 52-77556
Jun. 29, 1977 [JP] Japan ................................ 52-77557

[51] Int. Cl.² .............................................. H03D 3/00
[52] U.S. Cl. .................................... 329/132; 325/475; 329/133
[58] Field of Search ............... 329/110, 131, 132, 133, 329/136; 325/472–476, 480, 482, 483

[56] References Cited

U.S. PATENT DOCUMENTS 3,568,078   3/1971   Pelchat ................................ 329/110
3,611,169   10/1971  Hess et al. ....................... 329/132 X Primary Examiner—Siegfried H. Grimm
Attorney, Agent, or Firm—Haseltine, Lake & Waters

[57] ABSTRACT

A system comprising a demodulator for demodulating an input FM signal which has been subjected to interference by another FM signal, an envelope detector for detecting the envelope of fluctuation of the amplitude of the input signal, an AGC circuit for controlling the level of the input signal supplied to the envelope detector, a capacitor for passing only the AC component of the output of the envelope detector, a circuit having a transfer characteristic of a hyperbolic function and converting the waveform of the AC component, an analog multiplier supplied at its x input terminal with the output of the waveform converting circuit and producing a distortion cancellation signal, a first operation circuit supplied with the output signal of the demodulator and with the distortion cancellation signal and carrying out an operation such as substantially cancelling the interference distortion of the demodulated signal with the distortion cancellation signal, a delay circuit for delaying the output signal of the first operation circuit or of the demodulator by a specific time, and a second operation circuit supplied with the output signal of the first operation circuit or of the demodulator and with the output signal of the delay circuit, thereby carrying out a signal combining operation and supplying the resulting output signal to the y input terminal of the analog mutliplier. The output of the first operation circuit is demodulated signal in which the interference distortion has been canceled and thus removed.

8 Claims, 11 Drawing Figures

SYSTEM FOR REMOVING INTERFERENCE DISTORTION IN THE DEMODULATED SIGNAL OF A FREQUENCY-MODULATED SIGNAL

BACKGROUND OF THE INVENTION

The present invention relates generally to methods of removing interference distortion such as multipath distortion contained in signals obtained by demodulating frequency-modulated signals. More particularly, the invention relates to a method wherein a distortion component closely approximating an interference distortion contained in a signal obtained by demodulating a frequency-modulated signal is formed and used to cancel and remove the interference distortion.

In general, when a plurality of frequency-modulated signals (hereinafter referred to as FM signals) interfere with each other, interference distortion is produced. This phenomenon occurs in cases such as that, for example, wherein FM signals which have passed through a plurality of propagation paths (multipaths) interfere with each other, and this interference distortion is called multipath distortion. For example, in the case where an FM broadcast wave is directly received at the antenna of an FM receiver and, at the same time, is received after being reflected or diffracted by objects such as buildings, the FM signals thus received after passing through multipaths in this manner interfere with each other and give rise to interference distortion in the demodulated signal.

In order to reduce the generation of multipath distortion of this character, it has been a practice in known FM receivers to use antennas of sharp directional characteristic by which only directly arriving FM signals can be readily received, while FM signals arriving after being reflected or diffracted are not easily received. However, the occurrence of multipath distortion cannot be fully reduced by merely relying on only the directional characteristic of the antenna.

Accordingly, a method wherein a signal approximating the interference distortion component is formed by an electrical circuit within the FM receiver and used to cancel the distortion component in the demodulated signal has been tried. In this known method, however, the degree of approximation of the signal caused to approximate the distortion for the purpose of canceling the distortion component is very rough. For this reason, the signal components of the signal for distortion cancellation and the actual distortion component, strictly speaking, are considerably far apart, whereby distortion cancellation cannot be satisfactorily carried out, and, even after the distortion cancellation operation, a substantial distortion component remains.

In this connection, mutual interference of FM signals is not limited to only FM broadcasting but occurs in other instances such as the case of recording and reproducing of an FM signal on and from a recording medium and the case where there is mismatching between a cable for transmitting an FM signal and the related input and output equipments.

SUMMARY OF THE INVENTION

Accordingly, it is a general object of the present invention to provide a novel and useful system for removing interference distortion in the demodulated signal of an FM signal in which system the above described difficulties and problems are overcome.

Another and specific object of the invention is to provide an interference distortion removing system in which a signal for distortion cancellation which closely approximates the interference distortion in a demodulated signal of an FM signal is formed and used to cancel the distortion component.

Still another object of the invention is to provide an interference distortion removing system in which a waveform conversion circuit is used in a circuit system for forming a signal for distortion cancellation, and a signal for distortion cancellation of excellent degree of approximation with respect to interference distortion is obtained.

Other objects and further features of the invention will be apparent from the following detailed description with respect to preferred embodiments of the invention when read in conjunction with the accompanying drawings.

DETAILED DESCRIPTION

Figure 1:
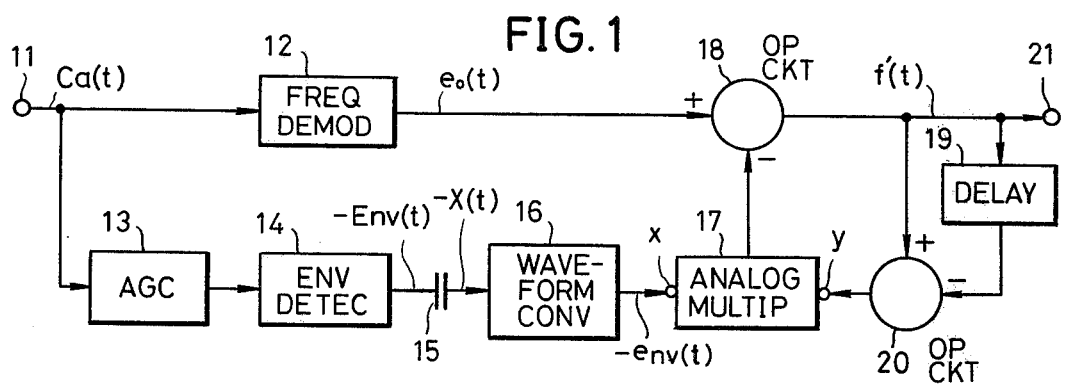
FIG. 1 is a block schematic diagram of a first embodiment of the interference distortion removing system according to the invention.

Referring first to FIG. 1 showing the first embodiment of the system of the invention in the form of a block diagram, a frequency-modulated (FM) signal $C_a(t)$ applied to an input terminal 11 of the system is supplied to a frequency demodulator 12, where it is demodulated. At the same time, the input FM signal $C_a(t)$ is supplied through an automatic gain control circuit (AGC circuit) 13 to an envelope detection circuit 14, where its envelope is detected.

In the case where there is an interference distortion, the input FM signal $C_a(t)$ is a combined wave of the original FM signal $C(t)$ without distortion and an FM signal $C(t-\tau)$ wherein this signal $C(t)$ has a time delay of $\tau$. Then, these FM signals can be respectively expressed by the following equations in terms of the modulating signal $f(t)$, the amplitude A of the carrier wave which is frequency modulated by this modulating signal, the carrier wave $\omega ct$, and the interference ratio K of the FM signal C(t) and the FM signal $C(t-\tau)$.

$$C(t) = A \cos \{\omega ct + f(t)\} \quad (1)$$

$$C(t-\tau) = A \cos \{\omega ct + f(t-\tau) - \omega c\tau\} \quad (2)$$

$$Ca(t) = A\cos[\{\omega ct + f(t)\} + K\{\omega ct + f(t-\tau) - \omega c\tau\}] \quad (3)$$
$$= A\sqrt{1 + K^2 + 2K\cos\{f(t) - f(t-\tau) + \omega c\tau\}}$$
$$\times \cos[\omega ct + f(t) - \tan^{-1}\frac{K\sin\{f(t)-f(t-\tau)+\omega c\tau\}}{1+K\cos\{f(t)-f(t-\tau)+\omega c\tau\}}]$$

An amplitude fluctuation occurs in the FM signal Ca(t) wherein the FM signals C(t) and $C(t-\tau)$ are causing an interference. The part represented by $A\sqrt{1+k^2+2K\cos\{f(t)-f(t-\tau)+\omega c\tau\}}$ in Eq.(3) is the envelope Env(t) of this amplitude fluctuation. Then, when the amplitude A of the carrier wave is taken as 1 (unity), this envelope Env(t) of the amplitude fluctuation is expressed by the following equation.

$$Env(t) = \sqrt{1+K^2+2K\cos\{f(t)-f(t-\tau)+\omega c\tau\}} \quad (4)$$

The interference ratio K is a coefficient determined by factors such as the loss incurred when the broadcast wave is reflected by reflecting objects and the damping of a reflected wave in accordance with the directional characteristic of the receiving antenna. Since K is less than 1 (unity), in general, Eq.(4) may be written as follows.

$$Env(t) \approx 1 + K\cos\{f(t)-f(t-\tau)+\omega c\tau\} \quad (5)$$

When the above mentioned FM signal Ca(t) is demodulated by the frequency demodulator 12, a demodulated signal $e_o(t)$ expressed by the following equation is obtained.

$$e_o(t) = f_o(t) - \frac{K^2\{f_o(t)-f_o(t-\tau)\}+K\{f_o(t)-f_o(t-\tau)\}\cos\{f(t)-f(t-\tau)+\omega c\tau\}}{1+K^2+2K\cos\{f(t)-f(t-\tau)+\omega c\tau\}} \quad (6)$$

When the condition $K < 1$ is considered, Eq.(6) becomes as follows.

$$e_o(t) = f_o(t) - \{f_o(t)-f_o(t-\tau)\}\frac{K\cos\{f(t)-f(t-\tau)+\omega c\tau\}}{1+2K\cos\{f(t)-f(t-\tau)+\omega c\tau\}} \quad (7)$$

By substituting X(t) for the quantity $K\cos\{f(t)-f(t-\tau)+\omega c\tau\}$ in the second term on the right-hand side of Eq.(7), the following equation is obtained.

$$e_o(t) = f_o(t) - \{f_o(t)-f_o(t-\tau)\}\frac{X(t)}{1+2X(t)} \quad (8)$$

Here, since fo(t) is a demodulated signal without distortion within the demodulated signal from the frequency demodulator 12, the second term in the right-hand side of Eqs.(6), (7), and (8) indicates an interference distortion component D(t).

$$D(t) = \{f_o(t)-f_o(t-\tau)\}\frac{X(t)}{1+2X(t)} \quad (9)$$

Accordingly, the demodulated signal $e_o(t)$ is expressed by the following equation.

$$e_o(t) = f_o(t) - D(t) \quad (10)$$

This demodulated signal $e_o(t)$ from the frequency demodulator 12 is supplied as a minuend signal to an operation circuit 18.

On the other hand, the above mentioned AGC circuit 13 operates to maintain the input FM signal Ca(t) as an FM signal of constant signal level and to maintain also constant the signal level of the amplitude envelope Env(t) of the FM signal.

The FM signal Ca(t) which has thus been level controlled by the AGC circuit 13 is supplied to the envelope detection circuit 14. The envelope detection circuit 14 is adapted to detect the envelope of negative polarity of the amplitude fluctuation of the FM signal Ca(t) and produces as output an envelope signal −Env(t). This envelope signal −Env(t) is the signal expressed by the foregoing Eq.(5) with the negative sign affixed thereto.

This envelope signal −Env(t) is passed through a capacitor 15 for suppressing DC component, by which its DC component is removed, and the envelope signal −X(t) of its AC component is supplied to a waveform conversion circuit 16. This envelope signal −X(t) of AC component is expressed by the following equation.

$$-X(t) = -K\cos\{f(t)-f(t-\tau)+\omega c\tau\} \quad (11)$$

Figure 2:
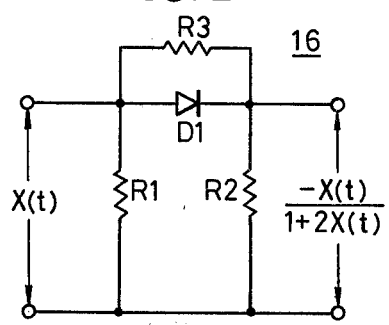
FIG. 2 is a circuit diagram of one embodiment of the waveform conversion circuit in the system shown in FIG. 1.
Figure 3:
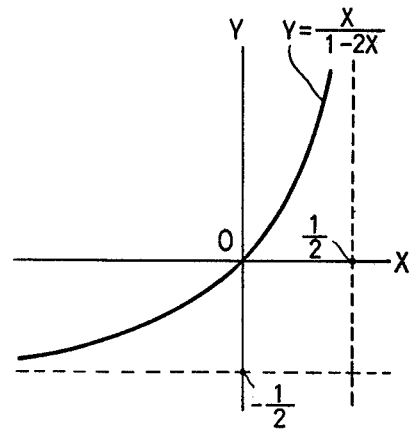
FIG. 3 is a graph indicating a characteristic of the waveform conversion circuit illustrated in FIG. 2.

In the present embodiment of the invention, the waveform conversion circuit 16 comprises resistors R1, R2, and R3 connected in $\pi$ formation and a diode D1 connected in parallel with the middle resistor R3 as shown in FIG. 2. Examples of the resistance values of the resistors R1, R2, and R3 are: R1=R2=6.8KΩ and R3=56KΩ. The waveform conversion circuit 16 has a transfer characteristic of a hyperbolic function $Y = X/(1-2X)$ as indicated in FIG. 3.

The waveform conversion circuit 16 produces as output a converted envelope signal $-e_{nv}(t)$ given by the following equation, which signal is supplied to the x input terminal of an analog multiplier 17.

$$-e_{nv}(t) = -\frac{X(t)}{1+2X(t)} \quad (12)$$

As described hereinafter, a demodulated signal fo(t) obtained from the operation circuit 18 is supplied as a minuend signal to an operation circuit 20 and, at the same time, is supplied to a delay circuit 19 for delay the signal by the time $\tau$. The time delay of the delaying circuit 19 is selected, for example to be equal to the time difference between the reflected radio wave of maximum level among the reflected waves and the unreflected, directly-received wave.

The output signal $fo(t-\tau)$ of the delay circuit 19 is supplied as a subtrahend signal to the operation circuit 20. The operation circuit 20 carries out subtraction of the signals fo(t) and $fo(t-\tau)$ and produces as output a signal expressed by $\{fo(t)-fo(t-\tau)\}$, which is supplied to the y input terminal of the analog multiplier 17. The analog multiplier 17 thereupon carries out multiplication of the signal $-e_{nv}(t)$ expressed by Eq.(12) from the waveform conversion circuit 16 and the signal from the operation circuit 20. The analog multiplier 17 thereby produces as output a distortion cancelling signal −D(t)

given by the following equation and supplies this signal as a subtrahend signal to the operation circuit 18.

$$-D(t) = -\{fo(t) - fo(t-\tau)\} \frac{X(t)}{1+2X(t)} \quad (13)$$

The signal expressed by Eq.(13) and supplied from the analog multiplier 17 to the operation circuit 18 has the same signal content as the interference distortion component D(t) expressed by Eq.(9) and supplied from the demodulator 12 to the operation circuit 18. In the operation circuit 18, an operation as indicated by the following equation is carried out.

$$e_o(t) - \{-D(t)\} = fo(t) - D(t) - \{-D(t)\} = fo(t) \quad (14)$$

Therefore, a demodulated signal fo(t) from which the distortion component has been removed is obtained as output from the operation circuit 18 and is led out through an output terminal 21.

It is to be noted that, in the present embodiment of the invention, the loop of the operation circuit 18→the delay circuit 19→the operation circuit 20→the analog multiplier 17→the operation circuit 18 constitutes a negative feedback loop, and for this reason, the interference distortion removing circuit operates stably.

In accordance with the present embodiment of the invention, particularly when the value of the interference ratio K is given by $K \leq 0.3$, the interference component in the demodulated signal can be removed to an extent where it becomes substantially zero. This has been verified by the results of experiments.

Figure 4:
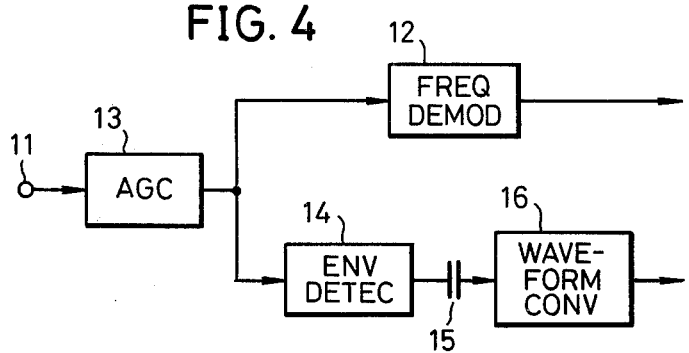
FIG. 4 is a block schematic diagram showing an example of modification of one part of the system shown in FIG. 1.

In the above described embodiment of the invention, the AGC circuit 13 is provided in the branch signal system provided with the envelope detection circuit 14 but it may be provided commonly in the stage in front of the frequency demodulator 12 and the envelope detection circuit 14 as shown in FIG. 4.

Figure 5:
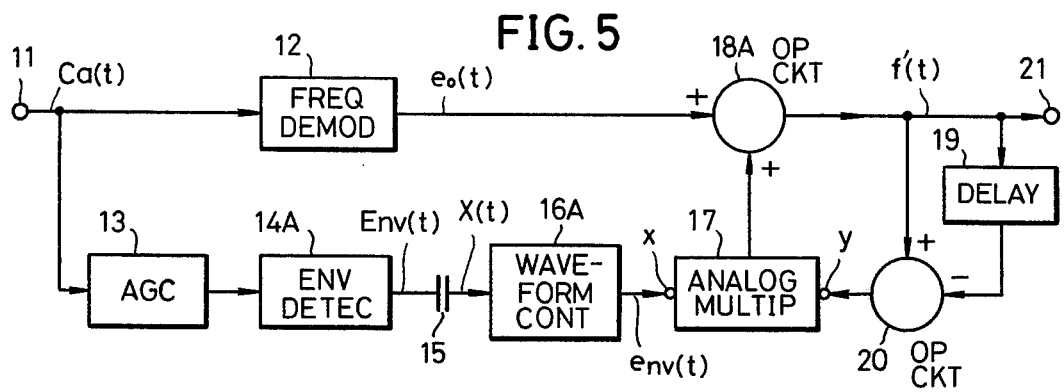
FIG. 5 is a block schematic diagram of a second embodiment of the interference distortion removing system according to the invention.

Next, the second embodiment of the system according to the invention will be described in conjunction with FIG. 5. In FIG. 5, those parts which are the same as or equivalent to corresponding parts in FIG. 1 are designated by like reference numerals or characters and will not be described in detail again.

In this second embodiment of the invention, the envelope detection circuit 14A is adapted to detect the envelope of positive polarity of the amplitude fluctuation of the FM signal Ca(t) and to produce an envelope signal Env(t).

This envelope signal Env(t) is passed through a capacitor 15 for suppressing DC component, by which its DC component is removed, and the envelope signal X(t) of its AC component is supplied to a waveform conversion circuit 16A. This envelope signal X(t) of AC component is expressed by the following equation.

$$X(t) = K \cos \{f(t) - f(t-\tau) + \omega c\tau\} \quad (11A)$$

Figure 6:
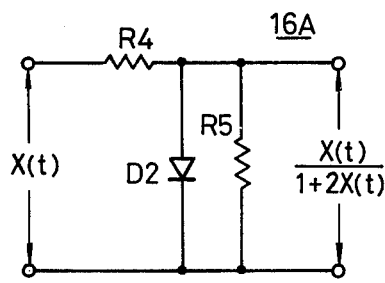
FIG. 6 is a circuit diagram of one embodiment of the waveform conversion circuit in the system illustrated in FIG. 5.
Figure 7:
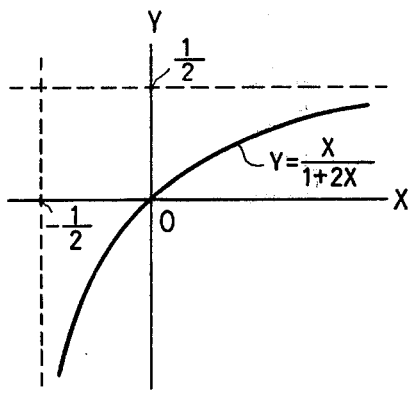
FIG. 7 is a graph indicating a characteristic of the waveform conversion circuit shown in FIG. 6.

In the present embodiment of the invention, the waveform conversion circuit 16A comprises resistors R4 and R5 connected in T formation and a diode D2 connected in parallel with the resistor R5 as shown in FIG. 6. The waveform conversion circuit 16A of this circuit construction has a characteristic of a hyperbolic function $Y = X/(1+2X)$ as indicated in FIG. 7.

The waveform conversion circuit 16A produces as output a converted envelope signal $e_{nv}(t)$ given by the following equation, which signal is supplied to the x input terminal of the analog multiplier 17.

$$e_{nv}(t) = \frac{X(t)}{1+2X(t)} \quad (12A)$$

The analog multiplier 17 thereupon carries out multiplication of the signal $e_{nv}(t)$ expressed by Eq.(12A) from the waveform conversion circuit 16A and the signal $\{fo(t) - fo(t-\tau)\}$ from the operation circuit 20. The analog multiplier 17 thereby produces as output a distortion cancelling signal D(t) given by the following equation and supplies this signal to the operation circuit 18A.

$$D(t) = \{fo(t) - fo(t-\tau)\} \frac{X(t)}{1+2X(t)} \quad (13A)$$

In the operation circuit 18, an operation of addition as indicated by the following equation is carried out.

$$e_o(t) + D(t) = fo(t) - D(t) + D(t) = fo(t) \quad (14A)$$

Therefore, a demodulated signal fo(t) from which the distortion component has been removed is obtained as output from the operation circuit 18 and is led out through an output terminal 21.

Figure 8:
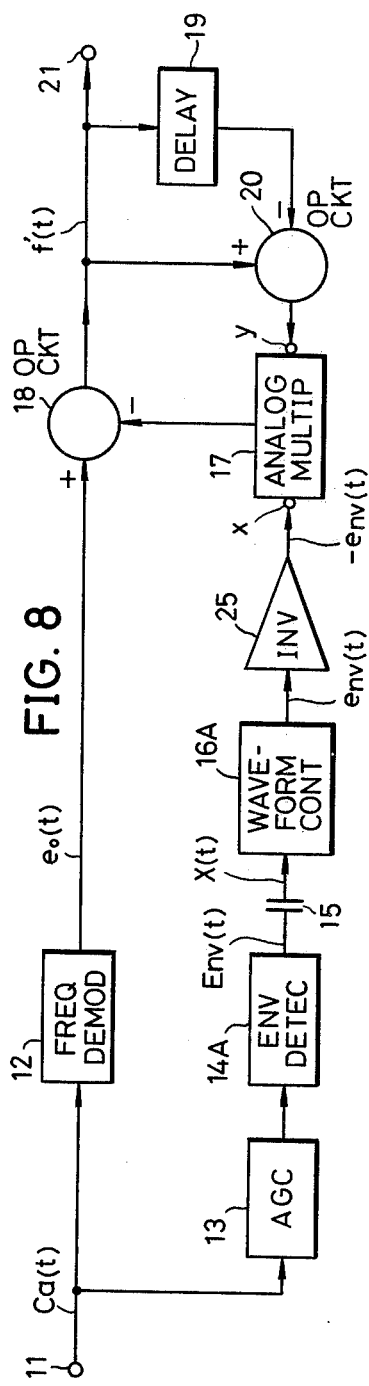
FIG. 8 is a block schematic diagram of a third embodiment of the interference distortion removing system according to the invention.

Next, the third embodiment of the system according to the invention will be described in conjunction with FIG. 8. In FIG. 8, those parts which are the same as or equivalent to corresponding parts in FIGS. 1 and 5 are designated by like reference numerals or characters and will not be described in detail again.

The converted envelope signal $e_{nv}(t)$ given by the Eq.(12A) from the waveform conversion circuit 16A is inverted in polarity at an inverter 25 into a signal $-e_{nv}(t)$ given by the Eq.(12), and is thereafter supplied to the x input terminal of the analog multiplier 17.

The analog multiplier 17 thereupon carries out multiplication of the signal $-e_{nv}(t)$ expressed by Eq.(12) from the inverter 25 and the signal $\{fo(t) - fo(t-\tau)\}$ from the operation circuit 20. The analog multiplier thereby produces as output a distortion cancelling signal $-D(t)$ and supplies this signal as a subtrahend signal to the operation circuit 18.

The operation circuit 18 carries out the operation expressed by the Eq.(14) with the demodulated signal $e_o(t)$ as a minuend and the distortion cancelling signal as a subtrahend. The operation circuit 18 produces the demodulated signal fo(t) from which the distortion component has been removed.

Figure 9:
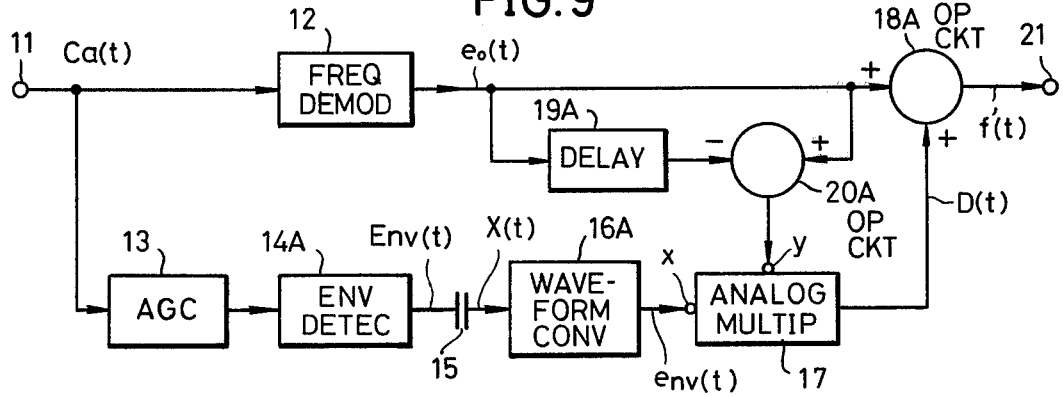
FIG. 9 is a block schematic diagram of a fourth embodiment of the interference distortion removing system according to the invention.

The fourth embodiment of the system according to the invention will be described in conjunction with FIG. 9. In FIG. 9, those parts which are the same as or equivalent to corresponding parts in FIGS. 1 and 5 are designated by like reference numerals or characters and will not be described in detail again.

The demodulated signal $e_o(t)$ from the frequency demodulator 12 is supplied to operation circuits 18A and 20A and to a delay circuit 19A. The demodulated signal is delayed by $\tau$ at the delay circuit 19A and is thereafter supplied to the operation circuit 20A. The operation circuit 20A carries out an operation of subtraction with the demodulated signal from the demodulator 12 and the demodulated and delayed signal from the delay circuit 19A and produces an output signal $\{fo(t) - fo(t-\tau)\}$ to be supplied to the y input terminal of the analog multiplier 17.

The analog multiplier 17 carries out multiplying the input signal $$\frac{X(t)}{1+2X(t)}$$

applied at the x input terminal and the input signal $\{fo(t)-fo(t-\tau)\}$ applied at the y input terminal thereby to produce the distortion cancelling signal D(t) to be supplied to the operation circuit 18A. The operation circuit 18A carries out the operation expressed by Eq.(14A). The demodulated signal fo(t) from which the distortion component has been cancelled is derived from the output terminal 21.

Figure 10A:
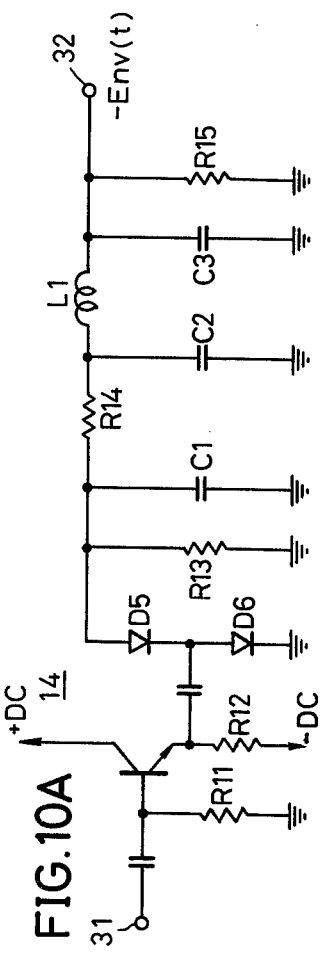
FIGS. 10A and 10B are circuit diagrams respectively showing examples of an envelope detection circuit.

FIG. 10A shows one example of a circuit construction of the envelope detection circuit 14 which detects the envelope of negative polarity of amplitude fluctuation of the input FM signal in the block system shown in FIG. 1. Examples of constants of respective circuit elements are as follows. Resistors: R11=R14=R15=2.2KΩ; R12=5.6KΩ; and R13=4.7KΩ. Capacitors: C1=680PF; and C2=C3=470PF. Inductor: L1=4.7mH. The output signal of the AGC circuit 13 is applied to the input terminal 31, while the detected signal of the envelope of negative polarity is derived from the output terminal 32.

Figure 10B:
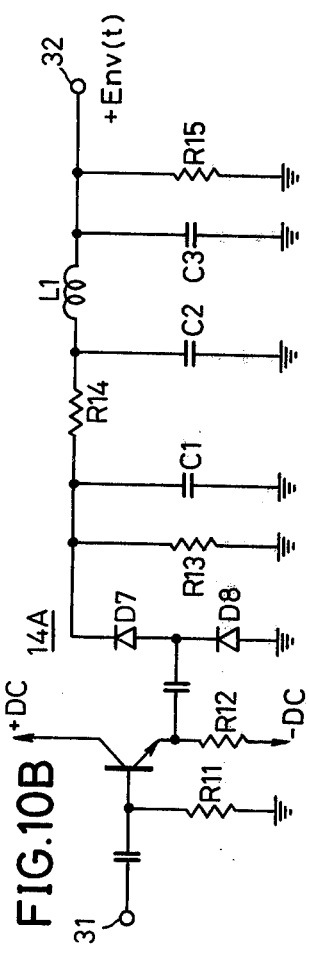

FIG. 10B shows one example of a circuit construction of the envelope detection circuit 14A in the block system shown in FIGS. 5, 8, and 9. The envelope detection circuit 14A employs diodes D7 and D8 of polarity opposite to the polarity of the diodes D5 and D6 of the detection circuit 14. A circuit construction other than the diodes D7 and D8 of the detection circuit 14A is same as that of the detection circuit 14.

Further, this invention is not limited to these embodiments but various variations and modifications may be made without departing from the scope and spirit of the invention.

What is claimed is:

1. A system for removing interference distortion in the demodulated signal of a frequency-modulated signal comprising:
   means for demodulating an input frequency-modulated signal which has been subjected to interference by another frequency-modulated signal;
   means for detecting the envelope of fluctuation of the amplitude of the input frequency-modulated signal;
   automatic gain control means for controlling the level of at least said input frequency-modulated signal supplied to said envelope detection means;
   means for blocking the passage of the DC component of the output of said envelope detection means and passing only the AC component thereof;
   means having a transfer characteristic of a hyperbolic function, supplied with said AC component, and converting the waveform thereof;
   an analog multiplier supplied at the x input terminal thereof with the output of said waveform converting means and producing as output a distortion cancellation signal;
   first operation means supplied with the demodulated signal produced as output by said demodulating means and containing interference distortion and with the output signal for distortion cancellation of said analog multiplier and carrying out an operation such as to substantially cancel the interference distortion of said demodulated signal with said distortion cancellation signal;
   delay means supplied with the output signal of said first operation means and delaying the same by a specific delay time;
   second operation means supplied with the output signal of said first operation means and with the output signal of said delay means, thereby carrying out a signal combining operation and supplying the resulting output signal thereof to the y input terminal of said analog multiplier; and
   means for obtaining the output of said first operation means as a demodulated signal in which the interference distortion has been cancelled and thus removed.

2. A system for removing interference distortion as claimed in claim 1 in which: said envelope detection means detects the envelope of negative polarity of the amplitude fluctuation of said input frequency-modulated signal; said first operation means carries out substraction of said distortion cancellation signal of said analog multiplier from the demodulated signal of said demodulation means; and said second operation means carries out substraction of the output signal of said delay means from the output signal of said first operation means.

3. A system for removing interference distortion as claimed in claim 1 in which: said envelope detection means detects the envelope of positive polarity of the amplitude fluctuation of said input frequency-modulated signal; said first operation means carries out addition of the demodulated signal from said demodulation means and said distortion cancellation signal from said analog multiplier; and said second operation means carries out subtraction of output signal of said delay means from the output signal of said first operation means.

4. A system for removing interference distortion as claimed in claim 1 which further comprises inverter means for inverting the polarity of the output of the envelope detection means, and in which: said envelope detection means detects the envelope of positive polarity of the amplitude fluctuation of said input frequency-modulated signal; said first operation means carries out subtraction of said distortion cancellation signal of said analog multiplier from the demodulated signal of said demodulation means; and said second operation means carries out subtraction of the output signal of said delay means from the output signal of said first operation means.

5. A system for removing interference distortion as claimed in claim 2 in which said waveform conversion means has a transfer characteristic of hyperbolic function expressed by $Y=X/(1-2X)$, where X and Y are the input signal and the output signal respectively of the waveform conversion means.

6. A system for removing interference distortion as claimed in claim 3 in which said waveform conversion means has a transfer characteristic of hyperbolic function expressed by $Y=X/(1+2X)$, where X and Y are the input signal and the output signal respectively of the waveform conversion means.

7. A system for removing interference distortion as claimed in claim 4 in which said waveform conversion means has a transfer characteristic of hyperbolic function expressed by $Y=X/(1+2X)$, where X and Y are the input signal and the output signal respectively of the waveform conversion means.

8. A system for removing interference distortion in the demodulated signal of a frequency-modulated signal comprising:

- means for demodulating an input frequency-modulated signal which has been subjected to interference by another frequency-modulated signal;
- means for detecting the envelope of fluctuation of the amplitude of the input frequency-modulated signal;
- automatic gain control means for controlling the level of at least said input frequency-modulated signal supplied to said envelope detection means;
- means for blocking the passage of the DC component of the output of said envelope detection means and passing only the AC component thereof;
- means having a transfer characteristic of a hyperbolic function, supplied with said AC component, and converting the waveform thereof;
- an analog multiplier supplied at the x input terminal thereof with the output of said waveform converting means and producing as output a distortion cancellation signal;
- first operation means supplied with the demodulated signal produced as output by said demodulating means and containing interference distortion and with the output signal for distortion cancellation of said analog multiplier and carrying out an operation such as to substantially cancel the interference distortion of said demodulated signal with said distortion cancellation signal;
- delay means supplied with the output signal of said demodulating means and delaying the same by a specific delay time;
- second operation means supplied with the output signal of said demodulating means and with the output signal of said delay means, thereby carrying out a signal combining operation and supplying the resulting output signal thereof to the y input terminal of said analog multiplier; and
- means for obtaining the output of said first operation means as a demodulated signal in which the interference distortion has been canceled and thus removed.